United States Patent [19]

Berglund et al.

[11] 4,362,347
[45] Dec. 7, 1982

[54] MODULAR CONNECTOR AND PROTECTOR

[75] Inventors: Sidney J. Berglund, Stillwater; Gary B. Matthews, Birchwood, both of Minn.

[73] Assignee: Minnesota Mining and Manufacturing Company, Saint Paul, Minn.

[21] Appl. No.: 210,856

[22] Filed: Nov. 26, 1980

Related U.S. Application Data

[62] Division of Ser. No. 75,737, Sep. 14, 1979, Pat. No. 4,272,147.

[51] Int. Cl.³ .............................................. H01R 13/66
[52] U.S. Cl. .............................. 339/14 R; 339/147 R; 339/198 R; 361/119; 361/120
[58] Field of Search ............ 339/147 R, 206 R, 221 R, 339/98, 99 R, 198 R, 198 H, 198 J, 14 R, 14 L, 147 P, 198 K, 198 N; 361/119, 120

[56] References Cited

U.S. PATENT DOCUMENTS

Re. 30,724  8/1981  Klayum et al. ................. 361/119
2,766,405  10/1956  Edmunds ........................ 339/198 N
3,708,779  1/1973  Enright et al. ................. 339/99 R
3,772,570  11/1973  Lange et al. ................... 361/120
3,945,705  3/1976  Seim et al. ..................... 339/98
3,985,416  10/1976  Dola et al. ..................... 339/98
4,059,331  11/1977  Sedlacek et al. .............. 339/198 R
4,071,876  1/1978  Benson et al. ................. 361/120
4,127,312  11/1978  Fleischhacker et al. ....... 339/99 R
4,334,257  6/1982  Ekdahl et al. ................. 361/119

FOREIGN PATENT DOCUMENTS 2201504  2/1973  Fed. Rep. of Germany ... 339/198 R
748284  4/1956  United Kingdom ............ 339/198 J Primary Examiner—John McQuade
Attorney, Agent, or Firm—Cruzan Alexander; Donald M. Sell; Terryl K. Qualey

[57] ABSTRACT

Modular wire-connector for connecting telephones to lines from central office permits adding second telephone to each station by using multislotted U-contact elements, and includes protector module for protection against incidental overvoltage. The two modules are positioned in a common bracket, the protector module being easily removed and reinserted.

1 Claim, 8 Drawing Figures

U.S. Patent    Dec. 7, 1982    4,362,347
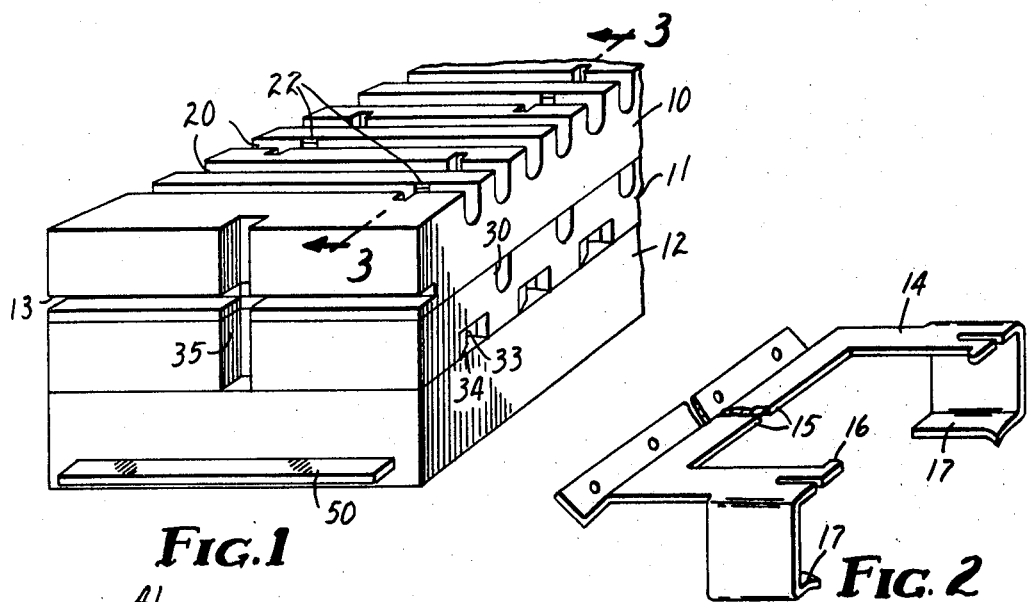
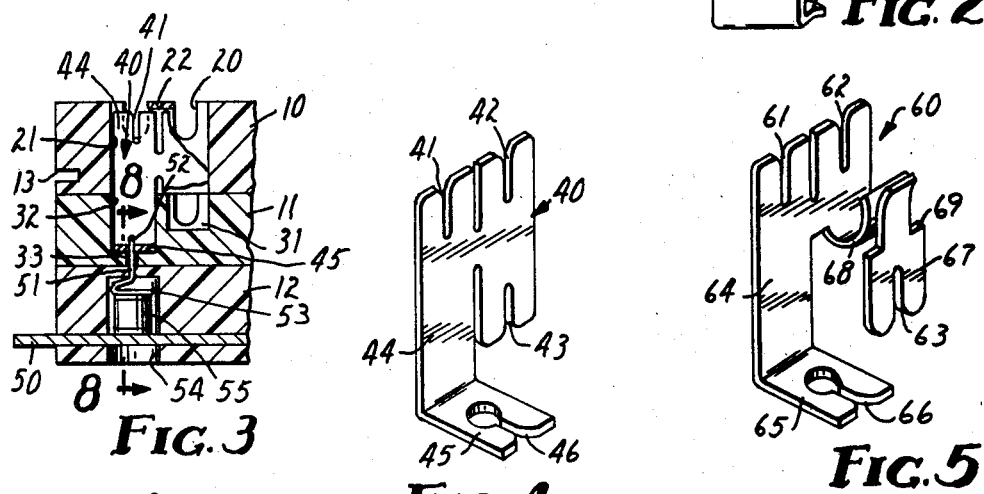
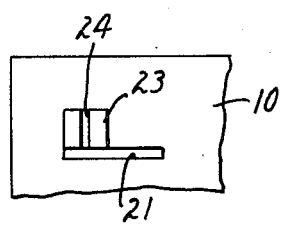
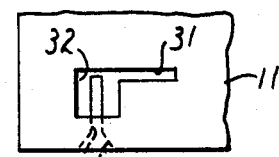
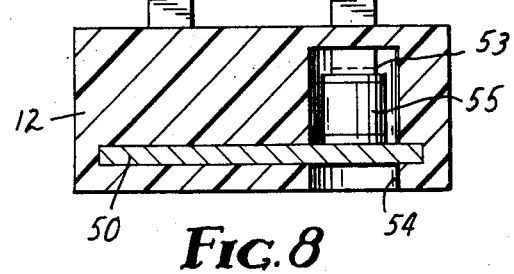

MODULAR CONNECTOR AND PROTECTOR

CROSS REFERENCE TO RELATED APPLICATION

This application is a division of copending application Ser. No. 75,737, filed Sept. 14, 1979 now U.S. Pat. No. 4,272,147.

This invention relates broadly to wire connectors as used in the telephonic communications art, and more particularly to modular connectors as used, for example, in making connection between wire pairs from a central office and wire pairs to subscribers. The invention relates also to the protecting of such connectors and lines against accidental overvoltage.

Modular wire splicing apparatus has been described, e.g. in Enright et al U.S. Pat. No. 3,708,779. Wire pairs are separated and held in channels. Wire ends are connected by means of slotted spring compression reserve U-connectors. Additional wire pair ends may be connected into the module by adding further body members.

The modular connectors of the present invention likewise provide for the wire ends to be held in channels and to be connected by means of slotted U-connectors, but also provide for connecting additional wire pair ends in the same module and without interfering with previous connections. There is also provided a component for protecting circuits and operators against incidental or accidenttal overvoltage, and which can be readily removed and replaced as desired.

IN THE DRAWING

FIG. 1 is a view in perspective showing a portion of the modular connector and associated voltage protector module, FIG. 2 is a view in perspective of a bracket for supporting the assembly of FIG. 1, FIG. 3 is a partial sectional view taken at section 3—3 of FIG. 1, with portions cut away to show detail, FIG. 4 is a view in perspective showing a contact element as used in the connector of FIG. 1, FIG. 5 is a view in perspective of an alternative form of contact element, FIG. 6 is a partial bottom plan view of the upper portion of the body of the module, FIG. 7 is a partial top plan view of the lower portion of the body of the module, and FIG. 8 is a sectional elevation of the protector module taken at section 8—8 of FIG. 3.

The assembly shown in FIG. 1 comprises an upper connector module portion 10, lower module portion 11, and protector module 12. It will be understood that such designations as "upper" and "lower" refer to the position of the assembly as shown in the drawing, since the parts may be mounted in any desired position. A groove 13 around three sides of the upper member serves for mounting the module on the bracket 14 of FIG. 2, the edge 15 of the bracket fitting within the groove. Spring tips 16 serve to releasably retain the module in place. Lower flanges 17 support and make electrical contact with bus bar 50 forming a component of protector module 12.

Upper portion 10 of the connector module is transversely grooved to provide a series of pairs of channels 20, each pair of which is connected by a narrow longitudinal pocket 21. The pockets of successive pairs of channels are in two longitudinally aligned parallel rows, only the first pocket of each row being shown in FIG. 1.

Lower portion 11 is similarly transversely grooved in line with the second of each pair of channels 20, forming channels 30. Portion 11 is further provided with narrow pockets 31 extending below the portion of pockets 21 crossing the second channel 20 of each pair, and broad pockets 32 extending below the portion crossing the first channel, as indicated in FIG. 3. A narrow slot 33 having a flared opening 34 extends from the front of each pocket 32 to the front face of the lower module portion 11.

The contact element 40 of FIG. 4 fits within the pockets 21, 31 and 32 in the insulative body members as shown in FIG. 3. The element includes a first wire-receiving U-slot 41 in alignment with the first channel 20, a second U-slot 42 in alignment with the second channel 20, a third U-slot 43 in alignment with the lower channel 30, and a dependent leg 44 ending in a foot 45 beneath the slot 41 and having a bifurcate end with the opening 46 in alignment with the slot 33. The element is inserted into the pocket 21 from the lower side of the upper member 10, the upper edges contacting the ledge 22 and the foot 45 contacting the downwardly extending post 23 (FIG. 6). The post 23 is centrally channeled at channel 24 in alignment with the slot 33. The element is normally retained within the pocket 21 by frictional contact along the flat faces, but if desired may be provided with spring tabs at its side edges for gripping the edge walls of pocket 21.

A vertical groove 35 at each end of the module permits mounting the members in a temporary support such for example as described in U.S. Pat. No. 3,708,779.

In a typical procedure, the lower member 11 is first mounted in a support, and pairs of wires are separated and laid in grooves 30. The upper member 10 is then pressed into place, the several wires entering the U-slots 43 and making spring compression reserve connection with the contact element 40. Any excess length of wire is removed. The post 23 enters the pocket 32 and assists in supporting the leg 44 and in frictionally holding the two members together. The assembly is fitted onto a bracket 14 which has been rigidly mounted to a grounded frame, and wires leading to telephone instruments are pressed into appropriate channels 20 of the upper member 10 to make connection with the contact elements 40 at U-slots 41, 42 as needed, using a suitable hand tool for the purpose. It will be apparent that a single pair of wires from the central office will require two adjacent slots 30 and will provide for connection with two pairs of subscriber wires at the appropriate slots 20.

The protector module 12 contains a bus bar 50 which extends outwardly at both ends, and a series of spring contacts 51 extending above the upper surface of the module as blades 52 and within a series of interior cavities 54 as folded springs 53. As further indicated in FIG. 8, these units are arranged in two parallel rows longitudinally of the member 12 and so as to come into contact with the contact foot 45 of each of the contact elements. Between each spring 53 and the bus bar 50 is located an overvoltage protector unit 55, such for example as a Siemens A80-A230X "uberstannungs ableiter" unit having a metal cap at each end of a ceramic cylinder containing an ionizable gas. The protector units are firmly held in place against the bus bar under the compression of the spring 53. They may be easily removed and replaced when desired, by sliding the bus bar endwise from the module.

The protector module is slid into position beneath the connector module assembly with the blades 52 entering the slots 33 and making contact with the bifurcate feet 45, and with the ends of the bus bar 50 making grounding contact with and being supported by the lower flanges 17 of the bracket 14.

Where selective circuit testing is anticipated, the alternative contact assembly 60 of FIG. 5 may be substituted for the simpler contact element 40 of FIG. 4. In this assembly the upper two U-slots 61 and 62, the dependent leg 64 and the bifurcate foot 65 with opening 66 remain the same as in element 40, but a separate plate 67 carries U-slots 63. Plate 67 is located forwardly of the plate carrying the other contact positions and is normally electrically connected with said plate through a spring contact extension 68 of that plate. Shoulders 69 on plate 67 act as stops when the plate is inserted into an appropriate pocket in the insulative body. The upper margins of plate 67 and spring extension 68 are accessible through an access opening provided across the appropriate channel 20 and are sufficiently divergent to permit entry of a test probe having two independent opposed contact surfaces. Entry of the probe separates the plates, breaks the contact, and permits circuit testing separately to the central office and to the subscriber circuit.

Additional structure, e.g. particularly as described in U.S. Pat. No. 3,708,779, may be included where found desirable for purposes of the present disclosure and has been omitted from the drawings and description in the interests of clarity and brevity. As an example, transverse ridges across the lower face of the upper module member 10 in alignment with the transverse channels 30 of the lower member serve to apply inserting and holding forces to wires laid in said channels. Blades incorporated in slots crossing said channels just forward of the contact elements and cooperating with portions of said ridges are advantageous in severing and removing excess lengths of wires. Vertical bosses or projections along the sides of the several wire receiving channels serve as stress relief members to hold the wires firmly in place. Lips projecting at the ends of channels 20 serve to prevent the wire ends from lifting out of the channel. Indicia for indicating the relative positioning of wires or for other purposes may be supplied. Hand tools fitting the channels and pockets of the upper module member for forcing wires into the U-slots of the contact elements and against suitably disposed cutting blades, and patterned after those disclosed in U.S. Pat. No. 3,708,779, are also contemplated. The sorting and splicing station of that patent is useful, in conjunction with an adapter where necessary because of differences in module dimensions and configurations, for holding the components during sorting and inserting of wires.

We claim:

1. An overvoltage protection module comprising an elongate body member, a bus bar passing longitudinally through said body member and extending outwardly at both ends, a series of protector capsules disposed within said body member with one end resting against said bus bar, and contact elements contacting the other end of each said capsule and extending above the outer upper surface of said body member as a series of transversely oriented blades disposed successively in two parallel longitudinal rows.

* * * * *